US010600655B2

(12) United States Patent
Peng et al.

(10) Patent No.: US 10,600,655 B2
(45) Date of Patent: Mar. 24, 2020

(54) CHEMICAL MECHANICAL POLISHING METHOD FOR TUNGSTEN

(71) Applicant: Rohm and Haas Electronic Materials CMP Holdings, Inc., Newark, DE (US)

(72) Inventors: Jia-De Peng, Taoyuan (TW); Lin-Chen Ho, Taichung (TW); Syin Hsu, Taoyuan (TW)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/961,133

(22) Filed: Apr. 24, 2018

(65) Prior Publication Data

US 2019/0051537 A1 Feb. 14, 2019

Related U.S. Application Data

(60) Provisional application No. 62/543,416, filed on Aug. 10, 2017.

(51) Int. Cl.

| | |
|---|---|
| *H01L 23/532* | (2006.01) |
| *H01L 21/768* | (2006.01) |
| *H01L 21/321* | (2006.01) |
| *H01L 21/3205* | (2006.01) |
| *H01L 21/306* | (2006.01) |
| *H01L 21/304* | (2006.01) |
| *H01L 21/302* | (2006.01) |
| *H01L 21/02* | (2006.01) |
| *C09G 1/02* | (2006.01) |
| *B24B 57/02* | (2006.01) |
| *B24B 37/07* | (2012.01) |
| *B24B 37/04* | (2012.01) |

(52) U.S. Cl.
CPC ........ *H01L 21/3212* (2013.01); *B24B 37/044* (2013.01); *C09G 1/02* (2013.01); *H01L 21/02175* (2013.01); *H01L 21/302* (2013.01); *H01L 21/304* (2013.01); *H01L 21/30625* (2013.01); *H01L 21/32051* (2013.01); *H01L 21/7684* (2013.01); *H01L 23/53257* (2013.01)

(58) Field of Classification Search
None
See application file for complete search history.

(56) References Cited

U.S. PATENT DOCUMENTS

| | | | |
|---|---|---|---|
| 6,375,694 | B1 | 4/2002 | Roberts et al. |
| 6,840,971 | B2 | 1/2005 | Wang et al. |
| 6,902,590 | B2 | 6/2005 | Weinstein et al. |
| 7,354,530 | B2 | 4/2008 | Wang et al. |
| 9,127,187 | B1 | 9/2015 | Grumbine et al. |
| 9,303,190 | B2 | 4/2016 | Ward et al. |
| 9,499,721 | B2 | 11/2016 | Grumbine et al. |
| 9,567,491 | B2 | 2/2017 | Fu et al. |
| 2002/0095872 | A1* | 7/2002 | Tsuchiya ............ C09G 1/02 51/307 |
| 2003/0040188 | A1* | 2/2003 | Hsu ............ H01L 21/3212 438/697 |
| 2015/0344738 | A1* | 12/2015 | Onishi ............ C09G 1/02 438/692 |
| 2015/0376462 | A1* | 12/2015 | Fu ............ C09G 1/02 438/693 |
| 2015/0380295 | A1* | 12/2015 | Guo ............ C09G 1/02 438/693 |
| 2017/0051181 | A1 | 2/2017 | Grumbine et al. |

* cited by examiner

*Primary Examiner* — Stephanie P Duclair
(74) *Attorney, Agent, or Firm* — John J. Piskorski

(57) ABSTRACT

A process for chemical mechanical polishing a substrate containing tungsten to at least reduce dishing of tungsten features of 100 μm or less. The process includes providing a substrate containing tungsten features of 100 μm or less; providing a polishing composition, containing, as initial components: water; an oxidizing agent; arginine or salts thereof; a dicarboxylic acid, a source of iron ions; a colloidal silica abrasive; and, optionally, a pH adjusting agent; and, optionally, a surfactant; and, optionally, a biocide; providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein some of the tungsten is polished away from the substrate and yet at least reducing dishing of the tungsten features of 100 μm or less.

10 Claims, No Drawings

CHEMICAL MECHANICAL POLISHING METHOD FOR TUNGSTEN

FIELD OF THE INVENTION

The present invention is directed to the field of chemical mechanical polishing of tungsten to at least inhibit dishing of the tungsten. More specifically, the present invention is directed to a method for chemical mechanical polishing of tungsten to at least inhibit dishing of the tungsten by providing a substrate containing tungsten, wherein the tungsten features have dimensions of 100 μm or less; providing a polishing composition, containing, as initial components: water; an oxidizing agent; arginine or salts thereof in sufficient amounts to at least inhibit dishing of the tungsten features; a dicarboxylic acid, a source of iron ions; a colloidal silica abrasive; and, optionally, a pH adjusting agent; and optionally, a surfactant; and, optionally, a biocide; providing a chemical mechanical polishing pad, having a polishing surface; creating dynamic contact at an interface between the polishing pad and the substrate; and dispensing the polishing composition onto the polishing surface at or near the interface between the polishing pad and the substrate where some of the tungsten is polished away from the substrate and at least dishing of the tungsten features is inhibited.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing a particular material.

Chemical mechanical polishing has become a preferred method for polishing tungsten during the formation of tungsten interconnects and contact plugs in integrated circuit designs. Tungsten is frequently used in integrated circuit designs for contact/via plugs. Typically, a contact or via hole is formed through a dielectric layer on a substrate to expose regions of an underlying component, for example, a first level metallization or interconnect. Tungsten is a hard metal and tungsten CMP runs at relatively aggressive settings which poses unique challenges for tungsten CMP. Unfortunately, many CMP slurries used to polish tungsten because of their aggressive nature cause the problem of over-polishing and dishing resulting in non-uniform or nonplanar surfaces. The term "dishing" refers to excessive (unwanted) removal of metal, such as tungsten, from metal interconnect precursors and other features on semiconductors during CMP, thereby causing unwanted cavities in the tungsten. Dishing is undesirable since, in addition to causing nonplanar surfaces, it negatively affects the electrical performance of the semiconductor. The severity of the dishing can vary but it typically is severe enough to cause erosion of underlying dielectric materials such as silicon dioxide (TEOS). Erosion is undesirable since the dielectric layer should ideally be flawless and free of cavities to endure optimal electrical performance of the semiconductor.

The topographical defects which can result from such dishing and erosion can further lead to non-uniform removal of additional materials from the substrate surface, such as barrier layer material disposed beneath the conductive material or dielectric material and produce a substrate surface having less than desirable quality which can negatively impact the performance of integrated circuits of the semiconductor. In addition, as features on the surface of semiconductors become more and more miniaturized, it becomes increasingly difficult to successfully polish the surfaces of the semiconductors.

Another problem associated with polishing tungsten is corrosion. The corrosion of tungsten is a common side-effect of CMP. During the CM' process the metal polishing slurry that remains on the surface of the substrate continues to corrode the substrate beyond the effects of the CM'. Sometimes corrosion is desired; however, in most semiconductor processes corrosion is to be reduced or inhibited.

Therefore, there is a need for a CM' polishing method and composition for tungsten which at least inhibits dishing of tungsten.

SUMMARY OF THE INVENTION

The present invention provides a method of chemical mechanical polishing tungsten, comprising: providing a substrate comprising tungsten and a dielectric, wherein tungsten features have dimensions of 100 μm or less; providing a chemical mechanical polishing composition, comprising, as initial components: water; an oxidizing agent; arginine or salts thereof in amounts of 10 to 500 ppm; a colloidal silica abrasive; a dicarboxylic acid or salt thereof; a source of iron (III) ions; and, optionally, a pH adjusting agent; and, optionally, a surfactant; and optionally, a biocide; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate and at least dishing of the tungsten features having dimensions of 100 μm or less is reduced.

The present invention provides a chemical mechanical method of polishing tungsten, comprising: providing the substrate comprising tungsten and a dielectric, wherein tungsten features have dimensions of 100 μm or less; providing a chemical mechanical polishing composition, comprising, as initial components: water; an oxidizing agent; arginine or salts thereof in amounts of 30 to 500 ppm; a colloidal silica abrasive having a negative zeta potential; a dicarboxylic acid or salt thereof; a source of iron (III) ions; and, optionally, a pH adjusting agent; and, optionally, a surfactant; and optionally, a biocide; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate and at least dishing of the tungsten features having dimensions of 100 µm or less is reduced; wherein the chemical mechanical polishing composition provided has a tungsten removal rate of ≥1000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The present invention provides a chemical mechanical method of polishing tungsten, comprising: providing a substrate comprising tungsten and a dielectric, wherein tungsten features have dimensions of 100 µm or less; providing a chemical mechanical polishing composition, comprising, as initial components: water; an oxidizing agent; arginine or salts thereof in amounts of 30 to 500 ppm; a colloidal silica abrasive having a negative zeta potential; malonic acid or salt thereof; a source of iron (III) ions; and, optionally, a pH adjusting agent; and, optionally, a surfactant; optionally, a biocide; providing a chemical mechanical polishing pad, having a polishing surface; creating dynamic contact at an interface between the chemical mechanical polishing pad and the substrate and at least dishing of the tungsten features having dimensions of 100 µm or less is reduced; and dispensing the chemical mechanical polishing composition onto the polishing surface of the chemical mechanical polishing pad at or near the interface between the chemical mechanical polishing pad and the substrate; wherein some of the tungsten is polished away from the substrate; wherein the chemical mechanical polishing composition provided has a tungsten removal rate of ≥1000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; wherein the chemical mechanical polishing pad comprises a polyurethane polishing layer containing polymeric hollow core microparticles and a polyurethane impregnated non-woven subpad.

The present invention provides a method of chemical mechanical polishing tungsten, comprising: providing the substrate comprising tungsten and a dielectric, wherein tungsten features have dimensions of 100 µm or less; providing a chemical mechanical polishing composition, comprising, as initial components: water; 0.01 to 15 wt % of an oxidizing agent, wherein the oxidizing agent is hydrogen peroxide; 30 ppm to 500 ppm of arginine or salts thereof; 0.01 to 10 wt % of a colloidal silica abrasive having a negative zeta potential; 100 to 1,400 ppm malonic acid or salt thereof; 100 to 1,100 ppm of a source of iron (III) ions, wherein the source of iron (III) ions is ferric nitrate; and, optionally, a pH adjusting agent; optionally a surfactant; optionally a biocide; wherein the chemical mechanical polishing composition has a pH of 1 to 7; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate and at least dishing of the tungsten features is reduced.

The present invention provides a method of chemical mechanical polishing tungsten, comprising: providing a substrate comprising tungsten and a dielectric, wherein tungsten features have dimensions of 100 µm or less; providing a chemical mechanical polishing composition, comprising, as initial components: water; 1 to 3 wt % of an oxidizing agent, wherein the oxidizing agent is hydrogen peroxide; 30 to 500 ppm of arginine or salts thereof, 0.2 to 5 wt % of a colloidal silica abrasive having a negative surface charge; 120 to 1,350 ppm of malonic acid; 150 to 700 ppm of a source of iron (III) ions, wherein the source of iron (III) ions is ferric nitrate; and, optionally, a pH adjusting agent; and, optionally an anionic ether sulfate surfactant; and, optionally, a biocide; wherein the chemical mechanical polishing composition has a pH of 2 to 3; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate and at least dishing of the tungsten features is reduced.

The foregoing methods of the present invention use a chemical mechanical polishing composition comprising arginine or salts thereof in amounts of 10 to 500 ppm; an oxidizing agent; a colloidal silica abrasive; a dicarboxylic acid or salt thereof; a source of iron (III) ions; water; and, optionally, a pH adjusting agent; and, optionally, a surfactant; and, optionally a biocide to polish tungsten and at the same time at least inhibit dishing of the tungsten to provide a substantially planar tungsten surface. In addition to inhibiting dishing, the chemical mechanical polishing compositions of the present invention can inhibit tungsten corrosion. The chemical mechanical polishing compositions of the present invention also have good tungsten to silicon dioxide selectivity.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; µ=µm=microns; kPa=kilopascal; Å=angstroms; mV=millivolts; DI=deionized; ppm=parts per million=mg/L; mm=millimeters; cm=centimeter; min=minute; rpm=revolutions per minute; lbs=pounds; kg=kilograms; W=tungsten; PO=propylene oxide; EO=ethylene oxide; ICP-OES=inductively coupled plasma optical emission spectroscopy; DLS=dynamic light scattering; wt %=percent by weight; and RR=removal rate.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "arginine" means the α-amino acid arginine and includes L-arginine (most common natural form). The term "TEOS" means the silicon dioxide formed from the decomposition of tetraethyl orthosilicate ($Si(OC_2H_5)_4$). The term "planar"

means a substantially flat surface or flat topography having two dimensions of length and width. The term "dimensions" refers to line widths. The terms "a" and "an" refer to both the singular and the plural. All percentages are by weight, unless otherwise noted. All numerical ranges are inclusive and combinable in any order, except where it is logical that such numerical ranges are constrained to add up to 100%.

The method of polishing a substrate of the present invention uses a chemical mechanical polishing composition containing an oxidizing agent; arginine or salts thereof in amounts of 10 ppm to 500 ppm; a colloidal silica abrasive; a dicarboxylic acid or salt thereof; a source of iron (III) ions; water; and, optionally, a pH adjusting agent; and, optionally, a surfactant; and optionally a biocide to provide for the removal of tungsten from the substrate surface while at least inhibiting dishing of the tungsten.

Preferably, the method of polishing a substrate of the present invention, comprises: providing the substrate, wherein the substrate comprises tungsten and a dielectric, wherein the tungsten features have dimensions of 100 µm or less, preferably, from 100 µm to 0.25 µm, more preferably, from 50 µm to 0.25 µm, even more preferably, from 10 µm to 0.25 µm and still more preferably, from 9 µm to 0.25 µm or, in the alternative, still more preferably, from 7 µm to 0.25 µm; providing a chemical mechanical polishing composition, comprising, (preferably, consisting of), as initial components: water; an oxidizing agent, preferably, in amounts of at least 0.01 wt % to 10 wt %, more preferably, in amounts of 0.1 wt % to 5 wt %, most preferably, from 1 wt % to 3 wt %; arginine or salts thereof or mixtures thereof in amounts of 10 ppm to 500 ppm, preferably, 30 ppm to 500 ppm; a colloidal silica abrasive, preferably, in amounts of 0.01 wt % to 15 wt %, more preferably, from 0.05 wt % to 10 wt %, even more preferably, from 0.1 wt % to 7.5 wt %, still more preferably, from 0.2 wt % to 5 wt %; a dicarboxylic acid, salt thereof or mixtures thereof, preferably, in amounts of 100 ppm to 1400 ppm, more preferably, from 120 ppm to 1350 ppm; a source of iron (III) ions, preferably, wherein the source of iron (III) ions is ferric nitrate; and, optionally, a pH adjusting agent; wherein the chemical mechanical polishing composition has a pH of 1 to 7; preferably, of 1.5 to 4.5; more preferably, 1.5 to 3.5; still more preferably, of 2 to 3; and, optionally, a surfactant; and, optionally, a biocide providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the tungsten is polished away from the substrate and at least dishing of the tungsten features is reduced, and, preferably, dishing of the tungsten features is reduced and tungsten corrosion is inhibited.

Preferably, the substrate provided is a semiconductor substrate comprising tungsten and a dielectric such as TEOS.

Preferably, in the method of polishing a substrate of the present invention, the water contained, as an initial component, in the chemical mechanical polishing composition provided is at least one of deionized and distilled to limit incidental impurities.

Preferably, in the method of polishing a substrate of the present invention, the chemical mechanical polishing composition provided contains, as an initial component, an oxidizing agent, wherein the oxidizing agent is selected from the group consisting of hydrogen peroxide ($H_2O_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizing agent is selected from the group consisting of hydrogen peroxide, perchlorate, perbromate; periodate, persulfate and peracetic acid. Most preferably, the oxidizing agent is hydrogen peroxide.

Preferably, in the method of polishing a substrate of the present invention, the chemical mechanical polishing composition provided contains, as an initial component, 0.01 to 10 wt %, more preferably, 0.1 to 5 wt %; most preferably, 1 to 3 wt % of an oxidizing agent.

Preferably, in the method of polishing a substrate of the present invention, the chemical mechanical polishing composition provided contains, as an initial component, a source of iron (III) ions. More preferably, in the method of the present invention, the chemical mechanical polishing composition provided contains, as an initial component, a source of iron (III) ions, wherein the source of iron (III) ions is selected from the group consisting iron (III) salts. Most preferably, in the method of the present invention, the chemical mechanical polishing composition provided contains, as an initial component, a source of iron (III) ions, wherein the source of iron (III) ions is ferric nitrate (Fe($NO_3$)$_3$).

Preferably, in the method of polishing a substrate of the present invention, the chemical mechanical polishing composition provided contains, as an initial component, a source of iron (III) ions sufficient to introduce 1 to 250 ppm, preferably, 5 to 200 ppm, more preferably, 7.5 to 150 ppm, most preferably, 10 to 100 ppm of iron (III) ions to the chemical mechanical polishing composition.

Preferably, in the method of polishing a substrate of the present invention, the chemical mechanical polishing composition provided contains, as an initial component, a source of iron (III) ions. More preferably, in the method of polishing a substrate of the present invention, the chemical mechanical polishing composition provided contains, as an initial component, 100 to 1,100 ppm, preferably, 125 to 1000 ppm, more preferably, 150 to 850 ppm, and, most preferably, 175 to 700 ppm of a source of iron (III) ions. Most preferably, in the method of polishing a substrate of the present invention, the chemical mechanical polishing composition provided contains, as an initial component, 100 to 1,100 ppm, preferably, 150 to 1000 ppm, more preferably, 150 to 850 ppm, most preferably, 175 to 700 ppm of a source of iron (III) ions, wherein the source of iron (III) ions is ferric nitrate (Fe($NO_3$)$_3$).

Preferably, in the method of polishing a substrate of the present invention, the chemical mechanical polishing composition provided contains, as an initial component, arginine (L-arginine), arginine salts, or mixtures thereof. Arginine salts include, but are not limited to, L-arginine HCl, arginine malate and N-methyl-L-arginine acetate salt. Preferably, the arginine salts are chosen from L-arginine HCl and N-methyl-L-arginine acetate, most preferably, the arginine salt is L-arginine HCl. Preferably, in the method of polishing a substrate of the present invention, arginine (L-arginine), instead of its salts and mixtures thereof, is included in the chemical mechanical polishing composition of the present invention. In the method of polishing a substrate of the present invention, the chemical mechanical polishing composition provided contains, as an initial component, 10 ppm to 500 ppm, preferably, 30 ppm to 500 ppm, more preferably, from 50 ppm to 500 ppm, even more preferably, from 30 ppm to 350 ppm; still even more preferably, from 30 ppm to 250 ppm, most preferably, from 30 ppm to 150 ppm (e.g. 30-50 ppm, 50-100 ppm or 50-150 ppm) of one or more of arginine (L-arginine) and salts thereof.

Preferably, in the method of polishing a substrate of the present invention, the chemical mechanical polishing composition provided contains a colloidal silica abrasive having a negative zeta potential. More preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 3; most preferably, from 2 to 2.5. Still more preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 3; most preferably, from 2 to 2.5 as indicated by a zeta potential from −0.1 mV to −20 mV.

Preferably, in the method of polishing a substrate of the present invention, the chemical mechanical polishing composition provided contains, as an initial component, a colloidal silica abrasive, wherein the colloidal silica abrasive has an average particle size ≤100 nm, preferably, 5 to 100 nm; more preferably, 10 to 90 nm; most preferably, 20 to 80 nm as measured by dynamic light scattering techniques.

Preferably, in the method of polishing a substrate of the present invention, the chemical mechanical polishing composition provided contains 0.01 to 15 wt %, preferably, 0.05 to 10 wt %, more preferably, 0.1 to 7.5 wt %, still more preferably, 0.2 to 5 wt %, most preferably, from 0.2 to 2 wt % of a colloidal silica abrasive. Preferably, the colloidal silica abrasive has a negative zeta potential.

In the method of polishing a substrate of the present invention, the chemical mechanical polishing composition provided can contain a mixed colloidal silica abrasive, wherein the mixed colloidal silica abrasive includes small particle colloidal silica abrasives comprising mean (average) particle sizes (as measured by DLS) of 40-50 nm, preferably, from 42-45 nm, more preferably, from 44-45 nm, in amounts of 0.01 to 7.5 wt %, preferably, 0.05 to 5 wt %, more preferably, 0.5 to 2 wt %, still more preferably, 0.5 to 1.5 wt %, most preferably, from 0.5 to 1 wt %, and includes large particle abrasives comprising mean (average) particle sizes of 70-100 nm, preferably, from 75-80 nm, more preferably, from 75-76 nm, in amounts of 0.01 to 7.5 wt %, still more preferably, 0.05 to 5 wt %, further more preferably, 0.5 to 2 wt %, still further more preferably, 0.5 to 1.5 wt %, most preferably from 0.5 to 1 wt %. Preferably the colloidal silica abrasives have a negative zeta potential.

Preferably, in the method of polishing a substrate of the present invention, the chemical mechanical polishing composition provided contains, as an initial component, a dicarboxylic acid, wherein the dicarboxylic acid includes, but is not limited to malonic acid, oxalic acid, succinic acid, adipic acid, maleic acid, malic acid, glutaric acid, tartaric acid, salts thereof or mixtures thereof. More preferably, in the method of polishing a substrate of the present invention, the chemical mechanical polishing composition provided contains, as an initial component, a dicarboxylic acid, wherein the dicarboxylic acid is selected from the group consisting of malonic acid, oxalic acid, succinic acid, tartaric acid, salts thereof and mixtures thereof. Still more preferably, the chemical mechanical polishing composition provided contains, as an initial component, a dicarboxylic acid, wherein the dicarboxylic acid is selected from the group consisting of malonic acid, oxalic acid, succinic acid, salts thereof and mixtures thereof. Most preferably, in the method of polishing a substrate of the present invention, the chemical mechanical polishing composition provided contains, as an initial component, the dicarboxylic acid malonic acid or salts thereof.

Preferably, in the method of polishing a substrate of the present invention, the chemical mechanical polishing composition provided contains, as an initial component, 1 to 2,600 ppm, preferably, 100 to 1,400 ppm, more preferably, 120 to 1,350 ppm, still more preferably, 130 to 1,100 ppm, of a dicarboxylic acid, wherein the dicarboxylic acid includes, but is not limited to, malonic acid, oxalic acid, succinic acid, adipic acid, maleic acid, malic acid, glutaric acid, tartaric acid, salts thereof or mixtures thereof. Preferably, in the method of polishing a substrate of the present invention, the chemical mechanical polishing composition provided contains, as an initial component, 1 to 2,600 ppm of malonic acid, salt thereof or mixtures thereof. More preferably, in the method of polishing a substrate of the present invention, the chemical mechanical polishing composition provided contains, as an initial component 100 to 1,400 ppm, even more preferably, 120 to 1,350 ppm, still more preferably, 130 to 1,350 ppm, of the dicarboxylic acid malonic acid or salts thereof.

Preferably, in the method of polishing a substrate of the present invention, the chemical mechanical polishing composition provided has a pH of 1 to 7. More preferably, in the method of polishing a substrate of the present invention, the chemical mechanical polishing composition provided has a pH of 1.5 to 4.5. Still more preferably, in the method of polishing a substrate of the present invention, the chemical mechanical polishing composition provided has a pH of 1.5 to 3.5. Even still more preferably, in the method of polishing a substrate of the present invention, the chemical mechanical polishing composition provided has a pH of 2 to 3; and, most preferably, a pH of 2 to 2.5.

Preferably, in the method of polishing a substrate of the present invention, the chemical mechanical polishing composition provided, optionally, contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of nitric acid and potassium hydroxide. Most preferably, the pH adjusting agent is potassium hydroxide.

Optionally, in the method of polishing a substrate of the present invention, the chemical mechanical polishing composition provided contains a surfactant. Preferably, in the method of polishing a substrate of the present invention, the surfactant is a PO or EO or PO/EO containing surfactant. More preferably, in the method of polishing a substrate of the present invention, the surfactant is a PO or EO or PO/EO surfactant containing an anionic functional group. Even more preferably, in the method of polishing a substrate of the present invention, the surfactant is an anionic ether sulfate having formula (I):

$$C_nH_{2n+1}O\text{---}PO_x\text{-}EO_y\text{---}SO_3^-$$

wherein n can be 12, 15, 18, 20, 22, 25, 28, 30, 35, 38, 40, 42 or 44; x can be 0, 2, 5, 8, 10, 12, 14, 16, 18, 20, 30, 40 or 50; and y can be 0, 5, 10, 15, 20, 25, 30, 35, 40, 45, 50, 55, 60, 65, 70, 80, 90 or 100 with the proviso that x and y cannot be 0 at the same instance, and a counter ion can preferably be an alkali metal ion such as sodium cation or potassium cation; or an ammonium cation. Preferably, in the method of polishing a substrate of the present invention, the anionic ether sulfate is sodium lauryl either sulfate (SLES).

In the method of polishing a substrate of the present invention, the chemical mechanical polishing composition provided can contain, as an initial component, 50 ppm to 1000 ppm, preferably, 100 ppm to 900 ppm, more preferably, 120 ppm to 600 ppm, still more preferably, 140 ppm to 250 ppm, of an anionic ether sulfate. More preferably, in the method of polishing a substrate of the present invention, the chemical mechanical polishing composition provided contains, as an initial component, 50 to 1000 ppm, more preferably, 100 ppm to 900 ppm, even more preferably 120 ppm to 600 ppm, still more preferably, 140 ppm to 250 ppm, of an alkali metal salt of an anionic ether sulfate surfactant. Still more preferably, in the method of polishing a substrate of the present invention, the chemical mechanical polishing composition provided contains, as an initial component 50 ppm to 1000 ppm, preferably, 100 ppm to 900 ppm, more preferably, 120 ppm to 600 ppm, still more preferably, 140 ppm to 250 ppm, of sodium lauryl ether sulfate.

Optionally, the polishing composition can contain biocides, such as KORDEX™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of The Dow Chemical Company). Such biocides can be included in the chemical mechanical polishing compositions of the present invention in conventional amounts, as known to those of ordinary skill in the art.

Preferably, in the method of polishing a substrate of the present invention, the chemical mechanical polishing pad provided can by any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

Preferably, in the method of polishing a substrate of the present invention, the chemical mechanical polishing composition provided has a tungsten removal rate ≥1,000 Å/min; preferably, ≥1,500 Å/min; more preferably, ≥1,700 Å/min. More preferably, in the method of polishing a substrate of the present invention, wherein the chemical mechanical polishing composition provided has a tungsten removal rate of ≥1,000 Å/min; preferably, ≥1,500 Å/min; more preferably, ≥1,700 Å/min; and a W/TEOS selectivity of ≥2. Still more preferably, in the method of polishing a substrate of the present invention, wherein the tungsten is removed from the substrate at a removal rate of ≥1,000 Å/min; preferably, ≥1,500 Å/min; more preferably, ≥1,700 Å/min; and a W/TEOS selectivity of 2.5 to 15. Most preferably, in the method of polishing the substrate of the present invention, wherein the tungsten is removed from the substrate at a removal rate of ≥1,500 Å/min; preferably, ≥1,700 Å/min; and a W/TEOS selectivity of 7 to 8 and with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

Preferably, in the method of polishing a substrate of the present invention, wherein the chemical mechanical polishing composition provided comprises mixed colloidal abrasives of small mean particle sizes in combination with large mean particle sizes, the method of polishing a substrate of the present invention has a tungsten removal rate ≥1,900 Å/min; preferably, ≥2,000 Å/min; more preferably, ≥2,040 Å/min; and a W/TEOS selectivity of ≥11.

The following examples are intended to illustrate the dishing inhibiting performance of the chemical mechanical polishing composition of the present invention on tungsten, the corrosion inhibition performance of the chemical mechanical polishing composition of the present invention on tungsten and W/TEOS selectivity of one or more embodiments of the present invention but are not intended to limit its scope.

Example 1

Slurry Formulations

The chemical mechanical polishing compositions of this Example were prepared by combining the components in the amounts listed in Table 1 with the balance being DI water and adjusting the pH of the compositions to the final pH listed in Table 1 with 45 wt % potassium hydroxide.

TABLE 1

| Polishing Slurry # | Abrasive[1] (wt %) | Arginine[2] (ppm) | Fe(NO$_3$)$_3$ (ppm) | Malonic Acid (ppm) | H$_2$O$_2$ (wt %) | pH |
| --- | --- | --- | --- | --- | --- | --- |
| Control | 2 | — | 362 | 1320 | 2 | 2.5 |
| PS-1 | 2 | 30 | 362 | 1320 | 2 | 2.5 |
| PS-2 | 2 | 150 | 362 | 1320 | 2 | 2.5 |

[1]KLEBOSOL™ 1598-B25 (—) zeta potential abrasive slurry manufactured by AZ Electronics Materials, available from The Dow Chemical Company; and
[2]Available from Sigma-Aldrich as L-Arginine.

Example 2

Chemical Mechanical Polishing—Dishing Performance of Arginine CMP Slurries

The polishing experiments were performed on 200 mm blanket wafers installed on an Applied Materials 200 mm MIRRA® polishing machine. The polishing removal rate experiments were performed on 200 mm blanket 15 kÅ-thick TEOS sheet wafers from Novellus and W, Ti, and TiN blanket wafers available from WaferNet Inc., Silicon Valley Microelectronics or SKW Associates, Inc. All polishing experiments were performed using an IC1010™ polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 125 mL/min, a table rotation speed of 80 rpm and a carrier rotation speed of 81 rpm unless specified otherwise. A Kinik PDA33 Å-3 diamond pad conditioner (commercially available from Kinik Company) was used to dress the polishing pad. The polishing pad was broken in with the conditioner using a down force of 9.0 lbs (4.1 kg) for 15 minutes and 7.0 lbs (3.2 kg) for 15 minutes at 80 rpm (platen)/36 rpm (conditioner). The polishing pad was further conditioned ex-situ prior to polishing using a down force of 7 lbs (3.2 kg) for 24 seconds. The W dishing rates were determined using a KLA-Tencor RS100C metrology tool. The wafers had varying standard line width features as shown in Table 2.

TABLE 2

| Polishing Slurry # | 100 μm Dishing (Å) | 50 μm Dishing (Å) | 10 μm Dishing (Å) | 9 μm Dishing (Å) | 7 μm Dishing (Å) | 0.25 μm Dishing (Å) |
|---|---|---|---|---|---|---|
| Control | 1600 | 1500 | 772 | 298 | 491 | 182 |
| PS-1 | 1093 | 1037 | 636 | 300 | 427 | 152 |
| PS-2 | 1173 | 1045 | 519 | 86 | 219 | 86 |

As shown by the polishing results, the two slurries of the present invention overall had decreased dishing of the W feature in contrast to the Control slurry which excluded the arginine.

Example 3

W, TEOS Removal Rate and W, TEOS Maximum Polishing Temperature

The polishing experiments for W and TEOS removal rates were performed substantially as described in Example 2 using the same apparatus and parameters. The TEOS removal rates were determined by measuring the film thickness before and after polishing using a KLA-Tencor FX200 metrology tool. The W removal rates were determined using a KLA-Tencor RS100C metrology tool. The wafers were from WaferNet Inc., or Silicon Valley Microelectronics. The results are in Table 3.

TABLE 3

| Polishing Slurry # | W RR (Å/min) | TEOS RR (Å/min) | W/TEOS Selectivity | W Temp. (° C.) | TEOS Temp. (° C.) |
|---|---|---|---|---|---|
| Control | 1887 | 193 | 9.8 | 36 | 33 |
| PS-1 | 1729 | 211 | 8.2 | 39 | 34 |
| PS-2 | 1572 | 210 | 7.5 | 40 | 33 |

The arginine chemical mechanical polishing compositions of the present invention showed good W RR of greater than 1500 Å/min, TEOS RR of greater than 200 Å/min and good W/TEOS selectivity of between 7 and 9.

Example 4

Slurry Formulations

The chemical mechanical polishing compositions of this Example were prepared by combining the components in the amounts listed in Tables 4-6 with the balance being DI water and adjusting the pH of the compositions to the final pH listed in Tables 4-6 with 45 wt % potassium hydroxide.

TABLE 4

| Polishing Slurry # | Abrasive[1] (wt %) | Arginine[2] (ppm) | $Fe(NO_3)_3$ (ppm) | Malonic Acid (ppm) | $H_2O_2$ (wt %) | pH |
|---|---|---|---|---|---|---|
| Control | 2 | — | 362 | 1320 | 2 | 2.5 |
| PS-3 | 2 | 50 | 362 | 1320 | 2 | 2.5 |
| PS-4 | 2 | 500 | 362 | 1320 | 2 | 2.5 |

[1]KLEBOSOL ™ 1598-B25 (—) zeta potential abrasive slurry manufactured by AZ Electronics Materials, available from The Dow Chemical Company; and
[2]Available from Sigma-Aldrich as L-Arginine.

TABLE 5

| Polishing Slurry # | Abrasive[1] (wt %) | Arginine HCl[3] (ppm) | $Fe(NO_3)_3$ (ppm) | Malonic Acid (ppm) | $H_2O_2$ (wt %) | pH |
|---|---|---|---|---|---|---|
| Control | 2 | — | 362 | 1320 | 2 | 2.5 |
| PS-5 | 2 | 50 | 362 | 1320 | 2 | 2.5 |
| PS-6 | 2 | 500 | 362 | 1320 | 2 | 2.5 |

[1]KLEBOSOL ™ 1598-B25 (—) zeta potential abrasive slurry manufactured by AZ Electronics Materials, available from The Dow Chemical Company; and
[3]Available from Sigma-Aldrich as L-Arginine hydrochloride.

TABLE 6

| Polishing Slurry # | Abrasive[1] (wt %) | N-Methyl-Arginine Acetate[4] (ppm) | $Fe(NO_3)_3$ (ppm) | Malonic Acid (ppm) | $H_2O_2$ (wt %) | pH |
|---|---|---|---|---|---|---|
| Control | 2 | — | 362 | 1320 | 2 | 2.5 |
| PS-7 | 2 | 50 | 362 | 1320 | 2 | 2.5 |
| PS-8 | 2 | 500 | 362 | 1320 | 2 | 2.5 |

[1]KLEBOSOL ™ 1598-B25 (–) zeta potential abrasive slurry manufactured by AZ Electronics Materials, available from The Dow Chemical Company; and
[4]Available from Sigma-Aldrich as N-methyl-L-Arginine acetate.

Example 5

Corrosion Rate Inhibition Performance of Arginine CMP Slurries

The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 $cm^2$. The results of the corrosion tests are in Table 7.

TABLE 7

| Slurry # | W Corrosion Rate (Å/min) |
|---|---|
| Control | 33 |
| PS-3 | 10 |
| PS-4 | 2.7 |
| PS-5 | 10 |
| PS-6 | 3.2 |
| PS-7 | 14 |
| PS-8 | 9 |

The results of the corrosion rate tests showed that the chemical mechanical polishing slurries containing L-arginine, L-arginine hydrochloride and N-methyl-L-arginine acetate significantly reduced the corrosion of W on wafers in contrast to the control which excluded the arginine and the salts thereof.

Example 6

Slurry Formulations with Mixed and Unmixed Abrasives

The chemical mechanical polishing compositions of this Example were prepared by combining the components in the amounts listed in the tables below with the balance being DI water and adjusting the pH of the compositions to the final pH=2.5 with 45 wt % potassium hydroxide, nitric acid, or mixtures thereof.

TABLE 8

| Polishing Slurry # | Small Diameter Abrasive[1] (wt %) | Large Diameter Abrasive[2] (wt %) | Arginine[3] (ppm) | Fe(NO$_3$)$_3$ (ppm) | Malonic Acid (ppm) | H$_2$O$_2$ (wt %) |
|---|---|---|---|---|---|---|
| Control 1 | 2 | — | 30 | 362 | 1320 | 2 |
| Control 2 | — | 2 | 30 | 362 | 1320 | 2 |

[1]KLEBOSOL ™ 1598-B25 (—) zeta potential abrasive slurry manufactured by AZ Electronics mean particle size = 45 nm
[2]KLEBOSOL ™ 1498-B50 (—) zeta potential abrasive slurry manufactured by AZ Electronics mean particle size = 76 nm Materials, available from The Dow Chemical Company; and
[3]Available from Sigma-Aldrich as L-Arginine.

TABLE 9

| Polishing Slurry # | Small Diameter Abrasive[1] (wt %) | Large Diameter Abrasive[2] (wt %) | Arginine[3] (ppm) | Fe(NO$_3$)$_3$ (ppm) | Malonic Acid (ppm) | H$_2$O$_2$ (wt %) | Mean Particle Size (nm) |
|---|---|---|---|---|---|---|---|
| PS-9 | 1.5 | 0.5 | 50 | 362 | 1320 | 2 | 61 |
| PS-10 | 1.0 | 1.0 | 50 | 362 | 1320 | 2 | 68 |
| PS-11 | 0.5 | 1.5 | 50 | 362 | 1320 | 2 | 73 |

[1]KLEBOSOL ™ 1598-B25 (—) zeta potential abrasive slurry manufactured by AZ Electronics mean particle size = 45 nm
[2]KLEBOSOL ™ 1498-B50 (—) zeta potential abrasive slurry manufactured by AZ Electronics mean particle size = 76 nm Materials, available from The Dow Chemical Company; and
[3]Available from Sigma-Aldrich as L-Arginine.

Example 7

W/TEOS Selectivity of Mixed Vs. Unmixed Abrasives

The polishing experiments were performed on 200 mm blanket wafers installed on an Applied Materials 200 mm Mirra® polishing machine. The polishing removal rate experiments were performed on 200 mm blanket 15 kÅ-thick tetraethylorthosilicate (TEOS) sheet wafers from Novellus plus tungsten (W) blanket wafers available all from Wafernet. All polishing experiments were performed using an IC1010™ polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 125 mL/min, a table rotation speed of 80 rpm and a carrier rotation speed of 81 rpm unless specified otherwise. A Kinik PDA33 Å-3 diamond pad conditioner (commercially available from Kinik) was used to dress the polishing pad. The polishing pad was broken in with the conditioner using a down force of 9.0 lbs (4.1 kg) for 15 minutes and 7.0 lbs (3.2 kg) for 15 minutes at 80 rpm (platen)/36 rpm (conditioner). The polishing pad was further conditioned ex-situ prior to polishing using a down force of 7 lbs (3.2 kg) for 24 seconds. The TEOS removal rates were determined by measuring the film thickness before and after polishing using a KLA-Tencor FX200 metrology tool. The tungsten (W) removal rates were determined using a KLA-Tencor RS100C metrology tool.

TABLE 10

| Polishing Slurry # | W RR (Å/min) | TEOS RR (Å/min) | W/TEOS Selectivity | W Temp. (° C.) | TEOS Temp. (° C.) |
|---|---|---|---|---|---|
| Control 1 | 1729 | 211 | 8.2 | 42 | 38 |
| Control 2 | 2347 | 261 | 9.0 | 45 | 40 |
| PS-9 | 2044 | 172 | 11.9 | 44 | 36 |
| PS-10 | 2019 | 172 | 11.8 | 44 | 37 |
| PS-11 | 1954 | 176 | 11.1 | 44 | 37 |

The arginine chemical mechanical polishing compositions of the present invention with the mixed abrasives (mean particle sizes=61 nm, 68 nm and 73 nm, respectively) showed good W RR of greater than 1900 Å/min, and improved W/TEOS selectivity of greater than 11 in contrast to the arginine chemical mechanical polishing compositions which included a small mean particle size abrasive (45 nm) or a large mean particle size abrasive (76 nm).

What is claimed is:

1. A method of chemical mechanical polishing tungsten, comprising:
   providing a substrate comprising tungsten and a dielectric, wherein tungsten features have dimensions of 100 µm to 0.25 µm;
   providing a chemical mechanical polishing composition, comprising, as initial components:
   water;
   an oxidizing agent;
   an arginine salt selected from the group consisting of arginine malate, N-methyl-L-arginine acetate and mixtures thereof in amounts of 10 to 500 ppm;
   a colloidal silica abrasive having a negative zeta potential;
   a dicarboxylic acid,
   a source of iron (III) ions; and,
   optionally, a pH adjusting agent;
   optionally, a surfactant;
   optionally, a biocide;
   providing a chemical mechanical polishing pad, having a polishing surface;
   creating dynamic contact at an interface between the chemical mechanical polishing pad and the substrate; and
   dispensing the chemical mechanical polishing composition onto the polishing surface of the chemical mechanical polishing pad at or near the interface between the chemical mechanical polishing pad and the substrate to remove at least some of the tungsten and reduce dishing of the tungsten features and reduce corrosion of the tungsten features.

2. The method of claim 1, wherein the chemical mechanical polishing composition provided has a tungsten removal rate of ≥1500 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

3. The method of claim 1, wherein the chemical mechanical polishing composition, provided comprises, as initial components:
   the water;
   0.01 to 10 wt % of the oxidizing agent, wherein the oxidizing agent is hydrogen peroxide;
   30 to 500 ppm of the arginine salt selected from the group consisting of arginine malate, N-methyl-L-arginine acetate and mixtures thereof;
   0.01 to 15 wt % of the colloidal silica abrasive having the negative zeta potential;
   1 to 2,600 ppm of the dicarboxylic acid;
   100 to 1,100 ppm of the source of iron (III) ions, wherein the source of iron (III) ions is ferric nitrate; and,
   optionally, the pH adjusting agent;
   optionally, the surfactant;
   optionally, the biocide; and,
   wherein the chemical mechanical polishing composition has a pH of 1 to 7.

4. The method of claim 3, wherein the chemical mechanical polishing composition provided has a tungsten removal rate of ≥1500 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

5. The method of claim 1, wherein the chemical mechanical polishing composition, provided comprises, as initial components:
   the water;
   0.1 to 5 wt % of the oxidizing agent, wherein the oxidizing agent is hydrogen peroxide;
   30 to 250 ppm of the arginine salt selected from the group consisting of arginine malate, N-methyl-L-arginine acetate and mixtures thereof;
   0.05 to 10 wt % of the colloidal silica abrasive having the negative zeta potential;
   100 to 1,400 ppm of the dicarboxylic acid;
   150 to 1000 ppm of the source of iron (III) ions, wherein the source of iron (III) ions is ferric nitrate; and,
   optionally, the pH adjusting agent;
   optionally, an anionic ether sulfate surfactant; and,
   wherein the chemical mechanical polishing composition has a pH of 1.5 to 4.5.

6. The method of claim 5, wherein the chemical mechanical polishing composition provided has a tungsten removal rate of ≥1500 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

7. The method of claim 1, wherein the chemical mechanical polishing composition, provided comprises, as initial components:
   the water;
   0.1 to 3 wt % of the oxidizing agent, wherein the oxidizing agent is hydrogen peroxide;
   30 to 250 ppm of the arginine salt selected from the group consisting of arginine malate, N-methyl-L-arginine acetate and mixtures thereof;
   0.1 to 5 wt % of the colloidal silica abrasive having the negative zeta potential;
   120 to 1,350 ppm of the dicarboxylic acid, wherein the dicarboxylic acid is malonic acid;
   150 to 850 ppm of the source of iron (III) ions, wherein the source of iron (III) ions is ferric nitrate; and,
   optionally, the pH adjusting agent;
   optionally, an anionic ether sulfate surfactant; and,
   wherein the chemical mechanical polishing composition has a pH of 1.5 to 3.5.

8. The method of claim 7, wherein the chemical mechanical polishing composition provided has a tungsten removal rate of ≥1500 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

9. The method of claim 7, wherein the colloidal silica abrasive is a mixed colloidal silica abrasive comprising small mean particles sizes in combination with large mean particle sizes.

10. The method of claim 9, wherein the mixed colloidal silica abrasive comprises small mean particles of 40-50 nm and large mean particles of 70-100 nm.

* * * * *